United States Patent [19]

Okamura et al.

[11] Patent Number: 5,300,453
[45] Date of Patent: Apr. 5, 1994

[54] METHOD FOR PRODUCING SEMICONDUCTOR DEVICE

[75] Inventors: Yuji Okamura; Koichi Kudo; Yasuo Aki, all of Kyoto, Japan

[73] Assignee: Rohm Co., Ltd., Kyoto, Japan

[21] Appl. No.: 29,226

[22] Filed: Mar. 10, 1993

[30] Foreign Application Priority Data

Mar. 27, 1992 [JP] Japan .................................. 4-071441

[51] Int. Cl.⁵ .............................................. H01L 21/225
[52] U.S. Cl. ...................................... 437/142; 437/248; 148/DIG. 62
[58] Field of Search ................ 437/14, 142, 160, 248, 437/942, 943, 959; 148/DIG. 4, DIG. 6, DIG. 23, DIG. 40, DIG. 62; 118/724

[56] References Cited

U.S. PATENT DOCUMENTS

| | | | |
|---|---|---|---|
| 4,151,008 | 4/1979 | Kirkpatrick | 437/942 |
| 4,290,188 | 9/1981 | Ichinose et al. | 148/DIG. 62 |
| 4,503,087 | 3/1985 | Russo | 148/DIG. 4 |
| 4,717,588 | 1/1988 | Wilson et al. | 437/142 |
| 4,732,874 | 3/1988 | Sparks | 437/942 |

FOREIGN PATENT DOCUMENTS

| | | | |
|---|---|---|---|
| 0028108 | 8/1973 | Japan | 437/142 |
| 0190949 | 8/1986 | Japan | 437/142 |

Primary Examiner—Brian E. Hearn
Assistant Examiner—Chandra Chaudhari
Attorney, Agent, or Firm—Nikaido, Marmelstein, Murray & Oram

[57] ABSTRACT

A method for producing a semiconductor device, is composed of steps of: covering a lower side of a semiconductor wafer with a heavy metal and disposing the semiconductor wafer in a chamber; causing the heavy metal to diffuse into the semiconductor wafer by heating the semiconductor wafer with a heat source having a small thermal capacity; and thereafter, ceasing to heat with the heat source, then charging the chamber with a cooling gas.

11 Claims, 4 Drawing Sheets

METHOD FOR PRODUCING SEMICONDUCTOR DEVICE

BACKGROUND OF THE INVENTION

The present invention relates to a method for producing a semiconductor device, and more particularly to such a method for producing a semiconductor device capable of diffusing a heavy metal such as gold, platinum or the like at a high concentration in a lattice of a semiconductor crystal layer, the heavy metal acting as a life time killer.

Conventionally, to improve the switching velocity of a semiconductor device such as transistor, diode or the like, the way wherein a heavy metal such as gold, platinum or the like is diffused in a silicon (silicon) crystal substrate so as to reduce the life time of minority carriers is widely employed. Introduction of, for example, gold into a silicon crystal structure causes the gold atom to serve as a trap which assists in recombination of the minority carriers thereby shortening the life time thereof.

Diffusion of gold atoms in the crystal lattice is very rapidly achieved. Specifically, a diffusing treatment at about 1000° C. for several minutes allows the gold atoms to be uniformly delivered at a concentration which is equal to a solid solubility of gold in silicon at about 1000° C., taking the same effect as that exhibited with such treatment infinitely conducted. However, the solubility of gold in silicon greatly depends on the temperature; for instance, the concentration of gold at 1150° C. in a stable state is $5 \times 10^{16}/cm^3$ while it decreases to $2 \times 10^{16}/cm^3$ with a drop of temperature to 1050° C. An excess amount of gold resulting from the decrease in concentration, or substantially half of the total amount of gold contained in silicon crystal at 1150° C. goes out of the crystal lattice and is scatteredly separated in such a state as to come into fine masses and is deposited in silicon crystal. The deposited gold is electrically inert and no longer assists in recombination of the minority carriers. Accordingly, very rapid cooling is needed to maintain the effective concentration of gold in the crystal lattice which is obtained at a high temperature. This is because the rapid cooling will not give gold a sufficient time to diffuse and hence a high gold concentration can be maintained in the crystal lattice.

A conventional method for diffusing gold in a silicon crystal substrate is effected in such a manner as shown in FIG. 4. Specifically, a semiconductor wafer 6 formed with a semiconductor circuit such as transistor on the front side thereof and covered with a gold film on the reverse side thereof is placed on a quartz boat 15; and the wafer on the boat 15 is loaded into and taken out manually from a chamber 17 of a lateral-type furnace at a velocity of about 3 to 20 cm/second. The furnace has such a heater surrounding it. The reason why it is manually conducted is that an autoloader for conveying the quartz boat cannot follow the velocity needed for the above-mentioned rapid cooling.

Recently, however, as the diameter of a wafer increases to improve the productivity of semiconductor devices, the quartz boat is also up-scaled in length as well as in width. Accordingly, the boat becomes too heavy for an operator to move it. While the velocity for conveying the boat cannot be controlled accurately. Further, there is another problem that the operation of taking the boat out from the chamber is very dangerous because the temperature immediately after the semiconductor wafer and quartz boat is taken out is very high.

Moreover, the quartz boat is stopped once in the neighborhood of the exit of the chamber in the takeout operation, and the temperature of the chamber in the neighborhood of the exit is substantially low, while there exists an isothermal zone at a portion of more than 70 cm from the exist as can be seen from FIG. 5 showing a temperature distribution in the chamber of the lateral-type furnace. Therefore, if an up-scaled quartz boat (for example, 67.3 cm in length $B_2$; whereas the length $B_1$ of a conventional boat of usual size is 30.5 cm) is stopped at 15 cm inside from the exit, the wafers in the inner side are located near the high temperature zone and hence cannot be rapidly cooled. This results in a problem that the above-mentioned object of rapid cooling cannot be attained, and the quality of wafer becomes instable depending on the loading location.

Thus, an object of the present invention is to provide a producing method which is capable of efficiently diffusing a heavy metal in crystal lattice, as a life time killer such as gold or the like at a high concentration while being applicable to a semiconductor wafer having an enlarged diameter.

SUMMARY OF THE INVENTION

According to the present invention, there is provided a method for producing a semiconductor device, which comprises steps of: covering a lower side of a semiconductor wafer with a heavy metal and disposing the semiconductor wafer in a chamber; causing the heavy metal to diffuse into the semiconductor wafer by heating the semiconductor wafer with a heat source having a small thermal capacity; and thereafter, ceasing to heat with the heat source, then charging the chamber with a cooling gas.

It is preferable that the semiconductor wafer is automatically loaded into the chamber or taken out from the chamber by means of autoloader.

It is preferable that the heat source having the small thermal capacity is a light lamp annealer.

It is preferable that the light lamp is a halogen lamp.

It is preferable that the light lamp is xenon lamp.

It is preferable that the heat source having the small thermal capacity is a laser beam apparatus.

It is preferable that the heat source having the small thermal capacity is an electron beam apparatus.

It is preferable that the cooling gas is liquified gas of helium.

It is preferable that the cooling gas is a liquified gas of hydrogen.

It is preferable that the cooling gas is a liquified gas of nitrogen.

It is preferable that the cooling gas is a liquified gas of oxygen.

In the present invention, the heavy metal is diffused into the semiconductor wafer with using the heat source having a small thermal capacity; accordingly, a diffusion furnace also has a small thermal capacity. Hence, charging the chamber with the cooling gas immediately after stopping the operation of the heat source for raising the temperature of the chamber makes it possible to rapidly cool the semiconductor wafer, whereby the state of the heavy metal diffused at a high temperature can be fixed as it is. In addition, the heat source such as a lamp can directly heat the wafer or stops heating without moving the wafer; hence, the temperature distribution in the wafer becomes uniform, inhibiting diffusion instability.

Furthermore, the semiconductor wafer can be moved or conveyed after the furnace is cooled. Hence, loading into and taking out the semiconductor wafer can be automatically achieved using an autoloader, leading to automatization of whole steps including the step for diffusing step on the basis of a computer program.

DETAILED DESCRIPTION

Now, a method for producing a semiconductor device according to the present invention is described in more detail with reference to the drawings.

In the present invention, a semiconductor circuit is first formed on an upper side of a semiconductor wafer, then a heavy metal as a life time killer such as gold, platinum or the like is deposited to about 100 to about 500 Å on whole of lower side of the wafer by vacuum evaporation or sputtering.

Figure 1:
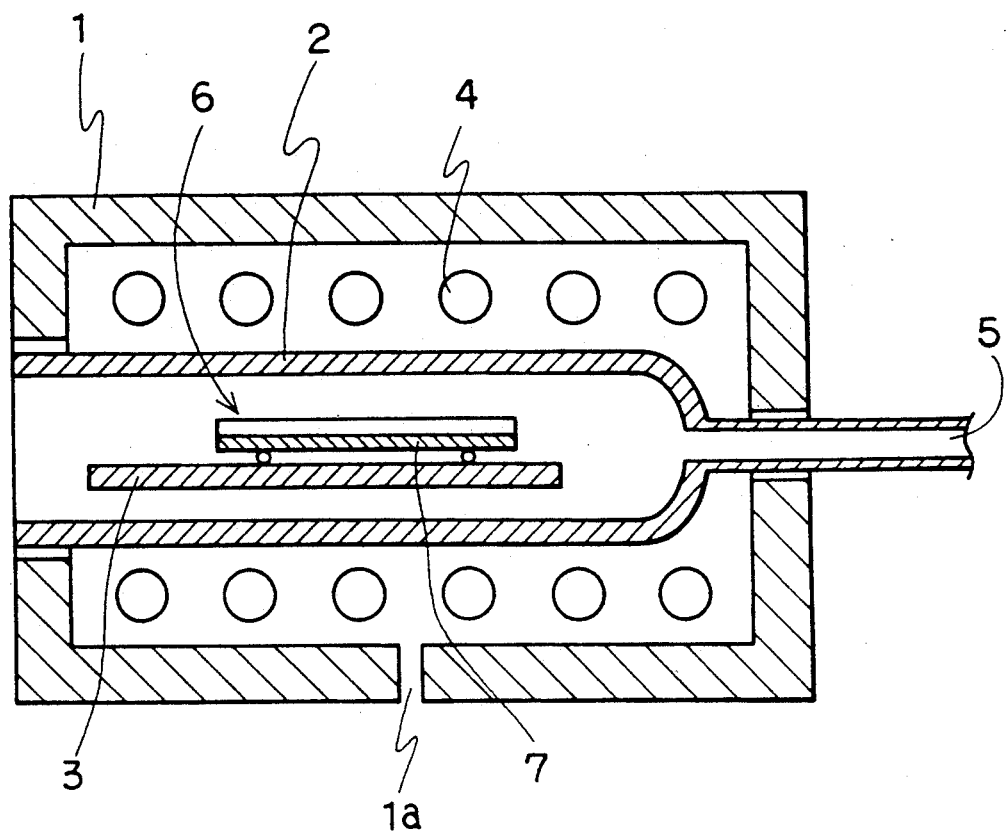
FIG. 1 is a schematic view for illustrating a method for producing a semiconductor device according to an embodiment of the present invention.

Next, as shown in FIG. 1, the semiconductor wafer 6 is placed in a chamber 2 of a heating furnace having a small thermal capacity, heated to about 900 to about 1100° C. and maintained at that temperature for about 0.5 to about 5 minutes with a heat source 4 such as a halogen lamp. Examples of the heating furnace having a small thermal capacity include those using a heat source having a small thermal capacity such as a light lamp or specifically a halogen lamp, xenon lamp or the like, a laser beam apparatus, an electron beam apparatus or the like. When the heat source is turned off, the temperature of such heating furnace drops sharply. Thereafter, the temperature of the semiconductor wafer 6 is lowered to about 900° C. temporarily by turning the heat source off. The wafer 6 is then cooled by charging the chamber 2 through a gas inlet 5 with a cooling gas. For the cooling gas, it is preferable to use a liquified gas of helium (boiling point: −268.9° C.) or hydrogen (boiling point: −252.9° C.) rather than that of nitrogen (boiling point: −195.8° C.) or oxygen (boiling point: −183° C.) in view of low gas temperature thereof. However, nitrogen or oxygen gas is usable in the rapid cooling. A lamp annealer using a halogen lamp, which is an example of the heating furnace, has a chamber 2 having a rectangular shape in section formed of quartz glass, silicon carbide or the like in which one semiconductor wafer 6 loaded on a quartz tray is placed. The chamber 2 is irradiated from above and below by halogen lamps surrounded with a reflector 1 as a heat source 4 to raise the temperature of the wafer 6. Any heater is not provided around the chamber 2 and only one semiconductor wafer 6 and a small quartz tray 3 are placed in the chamber. Accordingly, the thermal capacity of the heating furnace is extremely small. For this reason, by turning the heat source off to lower the temperature of the wafer 6 down to about 900° C. and maintain that temperature for about 50 to about 60 seconds, then charging the chamber 2 with the cooling gas at a flow rate of 35 to 40 l/sec, the wafer 6 at 900° C. can be rapidly cooled to 50° C. or below in 0.5 to 5 minutes. As a result, gold can be effectively diffused at a high concentration without separation in semiconductor crystal for the above-mentioned reason.

Next, the present invention will be more fully described by way of an exemplary embodiment.

Figure 2:
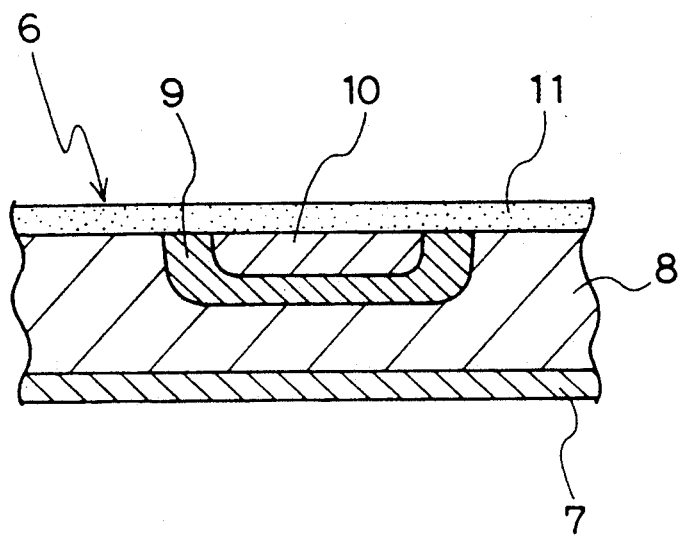
FIG. 2 is a schematic section showing a semiconductor device wherein the lower side of a semiconductor wafer is covered with gold.

FIG. 2 is a fragmentary section of a wafer for showing one chip portion, wherein a semiconductor wafer 6 is formed on the upper side thereof with a semiconductor circuit and deposited on the lower side thereof with gold by sputtering. Specifically, a base region 9 is formed in a collector region 8 formed of a n-type semiconductor substrate by diffusing an impurity such as boron; further an emitter region 10 is formed in the base region 9 by diffusing another impurity such as phosphorus, thus forming a transistor. The wafer 6 is deposited with gold 7 to about 400 Å thick on the lower side thereof by sputtering and formed with a protective film 11 of silicon $O_2$ on the front side thereof.

Figure 5:
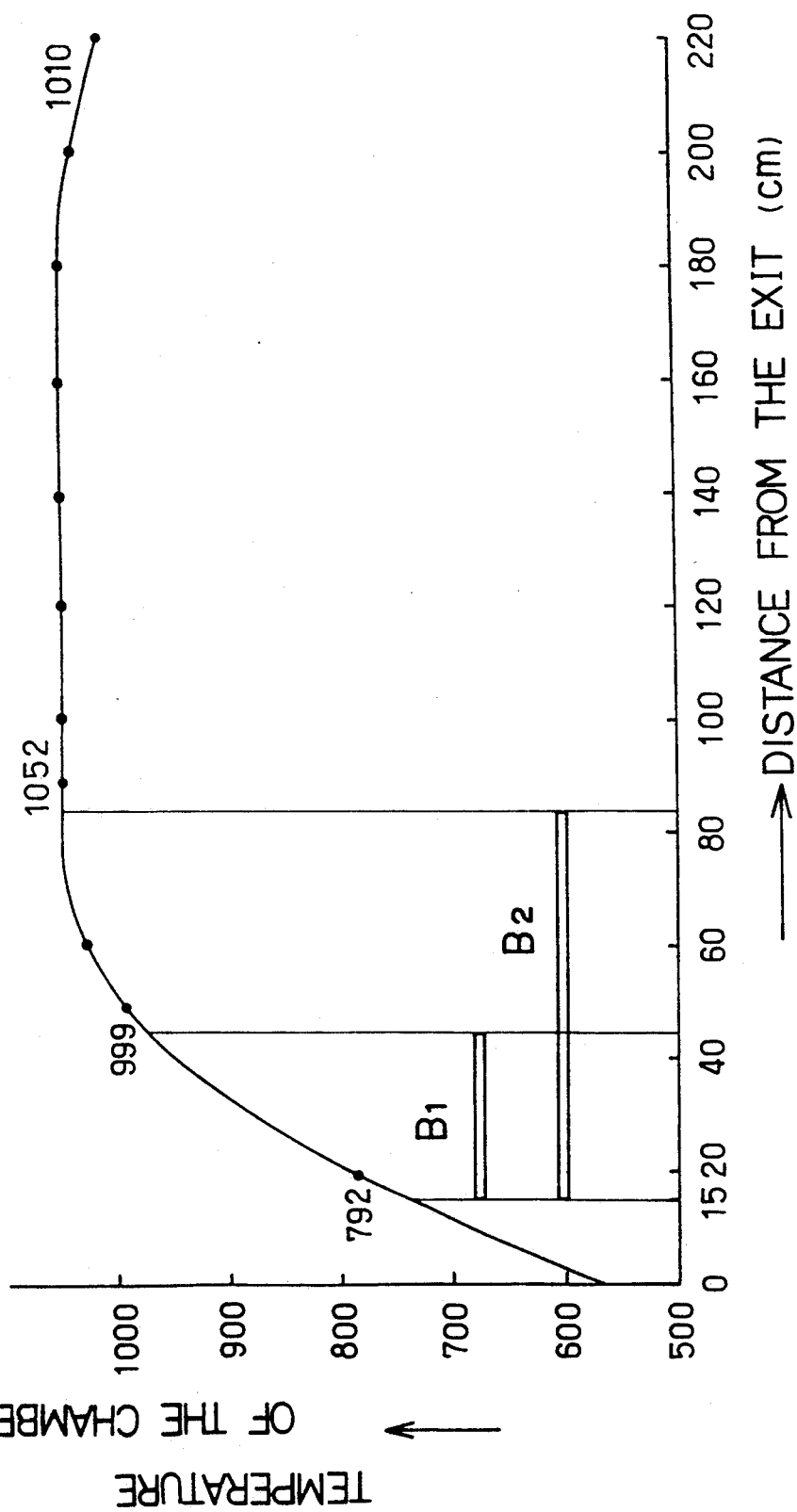
FIG. 5 is a diagram showing a temperature distribution in a furnace of the lateral type.

The semiconductor wafer 6 thus treated was loaded on a quartz tray 3 and placed in a central part of a chamber 2 of a lamp annealer shown in FIG. 5. Subsequently the atmosphere in the chamber 2 was substituted with oxygen gas. Halogen lamps as heat sources 4 were turned on to heat the wafer 6 in the chamber 2 up to about 900° C. by irradiation. Irradiation of still more 2 minutes caused the temperature of the wafer 6 to rise up to about 1050° C. and that temperature was maintained for about 5 minutes. The temperature of the wafer 6 was measured with a pyrometer and monitored through an inspection window 1a.

Next, the heat sources 4 were turned off to lower the temperature of the semiconductor wafer 6 down to about 900° C. temporarily, and then hydrogen gas at a sufficiently low temperature as a cooling gas was charged in the chamber 2 through a gas inlet 5 at a flow rate of 38 l/sec to cool the wafer 6. The wafer 6 was cooled down to about 25° C. in about 2 minutes, then conveyed to the outside of the chamber 2 by means of an autoloader (not shown). Subsequently, another semiconductor wafer was loaded on the autoloader and placed in the chamber 2. Each of semiconductor wafers is of the same size to have the same thermal capacity. Therefore, if the thickness of gold deposited on each wafer is set as the same thickness, diffusion of gold can be achieved under the same conditions. Accordingly, the step for diffusing gold herein described could be achieved in a fully autmated manner based on computer control.

Figure 3:
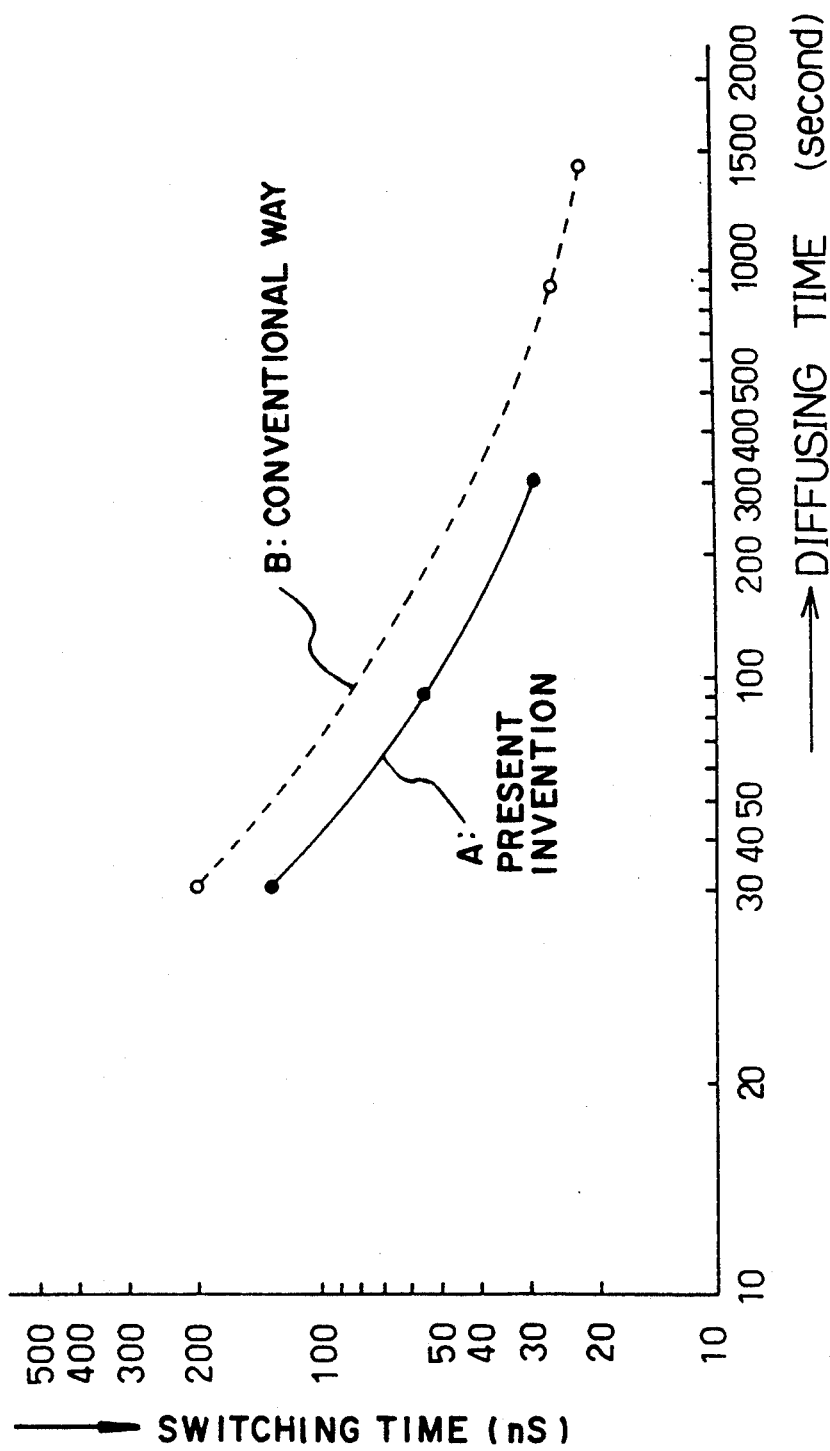
FIG. 3 is a graph wherein the switching time of a transistor produced according to a method of the present invention is compared with that of a transistor produced according to a conventional method.
Figure 4:
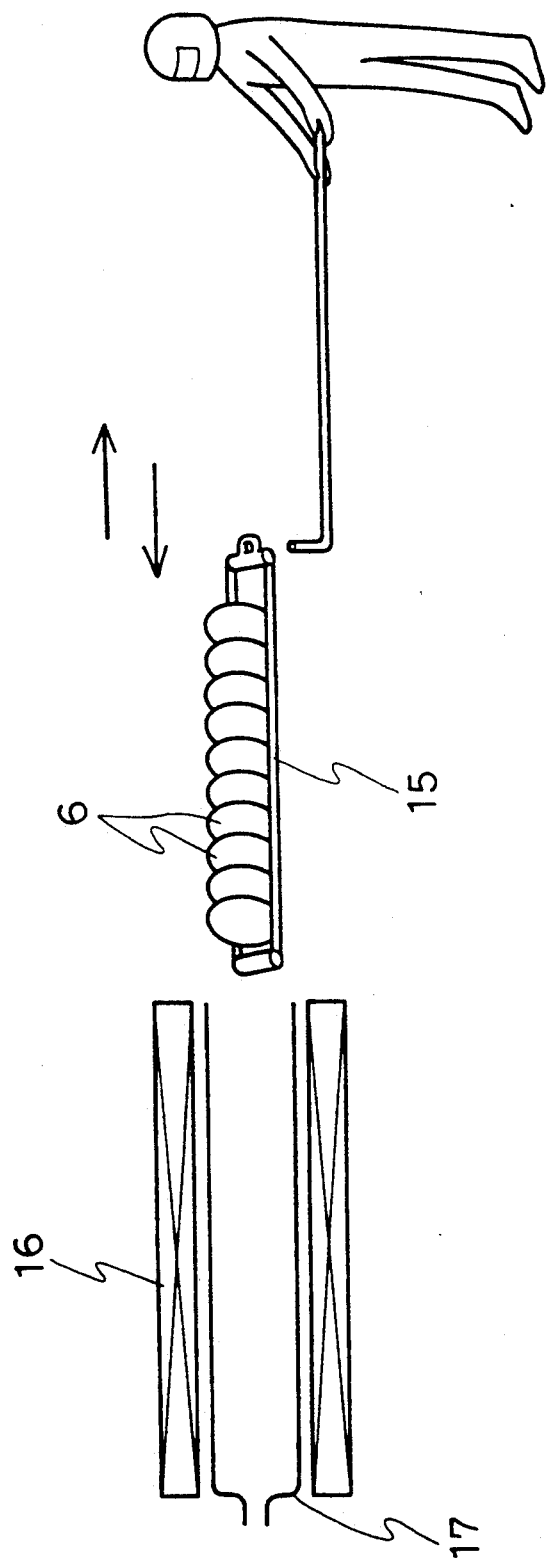
FIG. 4 is a schematic view for illustrating a conventional method for producing a semiconductor device.

Transistors formed in this method with the diffusing time varied as 0.5, 1.5 and 5 minutes, respectively were measured with respect to their switching time $t_{off}$, wherein the transistors were applied with pulse to change from ON state to OFF state, and whereupon a delay time of the output pulse relative to the input pulse in each of the transistors was measured. In FIG. 3 continuous line A indicates the relationship between the switching time $t_{off}$(nsec) and the diffusing time with the transistors formed according to the present method, while broken line B indicates such relationship with the comparative transistors formed by diffusing gold for 0.5, 15 and 30 minutes, respectively with use of a conventional lateral-type diffusion furnace.

As can be clearly seen from FIG. 3, generally the switching time becomes shorter, as the diffusion time is prolonged, and the switching time of the transistor formed according to the present invention is substantially shortened as compared with that of the comparative transistor diffused for the same period of time. Specifically, a diffusing time of 15 to 30 minutes was required to achieve a switching time of 20 to 30 nsec in accordance with the conventional method, while substantially the same switching time could be achieved by a diffusing time of only 5 minutes in accordance with the method of the present invention. This is because the present invention enables to effectively utilize the diffused heavy metal such as gold, platinum or the like without separating it.

As has been described, according to the present invention semiconductor wafers are diffused with a heavy metal such as gold and then cooled by stopping heating and directly introducing a cooling gas, one by one; hence, it is unnecessary for an operator to take out the wafer at a high temperature. This leads to a greatly reduced burden for the operator. In addition, since the wafer can be rapidly cooled, a dangerous operation for the operator can be eliminated.

Further, since there is no need to convey a semiconductor wafer kept at a high temperature, a semiconductor wafer can be automatically introduced in and taken out of the chamber by means of an autoloader. This leads to a fully automated system based on computer control for all the steps a step for loading a wafer into the chamber, diffusion, cooling and takeout of the wafer from the chamber. Furthermore, since the diffusing time can be substantially shortened than ever, carrying out the diffusing treatment for wafers one by one would not become a factor of increased cost. Rather, it would contribute to a decrease in cost because of complete unnecessity of human power. Besides, the present invention can provide semiconductor devices of a uniform quality because wafers can be uniformly heated.

In addition, even if the diameter of a semiconductor wafer is further enlarged, only to do is modify the shape of attachment of the autoloader.

Though several embodiments of the present invention are described above, it is to be understood that the present invention is not limited only to the above-mentioned and various changes and modifications may be made in the invention without departing from the spirit and scope thereof.

What is claimed is:

1. A method for producing a semiconductor device, which comprises steps of: covering a lower side of a semiconductor wafer with a heavy metal and disposing the semiconductor wafer in a chamber; causing the heavy metal to diffuse into the semiconductor wafer by heating the semiconductor wafer with a heat source having a small thermal capacity; and thereafter, ceasing to heat with the heat source, then charging the chamber with a cooling gas.

2. A method according to claim 1, wherein the semiconductor wafer is automatically loaded into the chamber or taken out from the chamber by means of autoloader.

3. A method according to claim 1, wherein the heat source having the small thermal capacity is a light lamp annealer.

4. A method according to claim 3, wherein the light lamp is a halogen lamp.

5. A method according to claim 3, wherein the light lamp is xenon lamp.

6. A method according to claim 1, wherein the heat source having the small thermal capacity is a laser beam apparatus.

7. A method according to claim 1, wherein the heat source having the small thermal capacity is an electron beam apparatus.

8. A method according to claim 1, wherein the cooling gas is liquified gas of helium.

9. A method according to claim 1, wherein the cooling gas is a liquified gas of hydrogen.

10. A method according to claim 1, wherein the cooling gas is a liquified gas of nitrogen.

11. A method according to claim 1, wherein the cooling gas is a liquified gas of oxygen.

* * * * *